United States Patent
Forejtek et al.

(10) Patent No.: US 12,413,064 B2
(45) Date of Patent: Sep. 9, 2025

(54) SHORT-CIRCUIT DETECTOR FOR ELECTRONIC FUSE CIRCUIT

(71) Applicant: SEMICONDUCTOR COMPONENTS INDUSTRIES, LLC, Scottsdale, AZ (US)

(72) Inventors: Jiri Forejtek, Vidce (CZ); Petr Rozsypal, Hutisko-Solanec (CZ)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 161 days.

(21) Appl. No.: 18/337,382

(22) Filed: Jun. 19, 2023

(65) Prior Publication Data

US 2024/0072530 A1 Feb. 29, 2024

Related U.S. Application Data

(60) Provisional application No. 63/373,892, filed on Aug. 30, 2022.

(51) Int. Cl.
*H02H 3/087* (2006.01)
*H03K 17/082* (2006.01)

(52) U.S. Cl.
CPC ......... *H02H 3/087* (2013.01); *H03K 17/0822* (2013.01); *H03K 2217/0027* (2013.01)

(58) Field of Classification Search
CPC ....... H02H 3/08; H02H 3/087; H03K 17/0822
See application file for complete search history.

(56) References Cited

U.S. PATENT DOCUMENTS

| | | | |
|---|---|---|---|
| 7,548,403 B2* | 6/2009 | Nagata | H02H 3/087 361/93.1 |
| 7,710,090 B1* | 5/2010 | Kimura | G05F 1/5735 323/276 |
| 2007/0146951 A1 | 6/2007 | Takahashi et al. | |
| 2011/0187340 A1 | 8/2011 | Deval et al. | |
| 2017/0047836 A1* | 2/2017 | Endo | G05F 1/56 |
| 2018/0287602 A1 | 10/2018 | Chauhan et al. | |

FOREIGN PATENT DOCUMENTS

| | | |
|---|---|---|
| EP | 0483744 A2 | 5/1992 |
| GB | 2248739 A | 4/1992 |

OTHER PUBLICATIONS

Extended European Search Report for counterpart European Patent Application No. 23185318.5, dated Feb. 13, 2024, 10 pages.

* cited by examiner

*Primary Examiner* — Rexford N Barnie
*Assistant Examiner* — Christopher J Clark
(74) *Attorney, Agent, or Firm* — Brake Hughes Bellermann LLP

(57) ABSTRACT

An electronic fuse that includes a clamp circuit to enhance the protection provided by the electronic fuse. The clamp circuit can detect a short circuit condition quickly and transmit a trigger signal to a controller so that a power transistor of the electronic fuse can be turned-OFF before the current through the power transistor causes overheating or damage. The clamp circuit is a dedicated circuit for short-circuit detection that can work with other current control circuits of the electronic fuse. The clamp circuit does not increase the power consumed by the electronic fuse while not in the short circuit condition. The clamp circuit is small and fast because it can use low-voltage devices, even as high voltages are present at the input and output of the electronic fuse.

20 Claims, 5 Drawing Sheets

SHORT-CIRCUIT DETECTOR FOR ELECTRONIC FUSE CIRCUIT

CROSS-REFERENCE TO RELATED APPLICATION

This application claims the benefit of U.S. Provisional Application, No. 63/373,892, filed on Aug. 30, 2022, which is hereby incorporated by reference in its entirety.

FIELD OF THE DISCLOSURE

The present disclosure relates to integrated, microelectronic circuits and more specifically to an electronic fuse circuit for fault protection.

BACKGROUND

An electronic fuse (e-fuse) can be coupled between an input power source and a load to protect the load from excessive conditions. An electronic fuse may be more versatile than traditional fuses for a few reasons. An electronic fuse may provide protection over a wide range of conditions such as overvoltage, over-current, overtemperature, and reverse polarity. An electronic fuse can disconnect a load from a current at a lower threshold level than a traditional fuse, which may correspond to smaller gauge wires that a system (e.g., vehicle) must use. Electronic fuses may be used for a variety of protection scenarios, such as protecting multiple devices coupled to a power bus from a load failure that shorts the power bus, and can be used in applications, such as RAID storage systems, cloud server systems, vehicle systems, telecommunication systems, industrial automation, and motors.

SUMMARY

In some aspects, the techniques described herein relate to an electronic fuse including: a power transistor coupled between an input and an output of the electronic fuse, the power transistor configurable in an OFF condition to disconnect the input from the output while a short-circuit condition exists at the output; and a clamp circuit configured to generate a clamp signal in response to the short-circuit condition, the clamp circuit including: a sense transistor coupled in parallel with the power transistor; a diode-connected transistor coupled between the input of the electronic fuse and in series with the sense transistor, the diode-connected transistor configured to conduct while the short-circuit condition exists so that the sense transistor conducts a sensed current corresponding to a current conducted by the power transistor while the short-circuit condition exists; and a trigger circuit configured to generate the clamp signal based on the sensed current.

In some aspects, the techniques described herein relate to a system including: a power source configured to generate output power; a load configured to operate based on the output power from the power source; and an electronic fuse coupled at an input to the power source and coupled at an output to the load, the electronic fuse including: a clamp circuit configured to generate a clamp signal in response to a short-circuit condition at the output, the clamp circuit including: a diode-connected transistor coupled between the input and in series with a sense transistor, the diode-connected transistor configured to conduct while the short-circuit condition exists so that the sense transistor conducts a sensed current corresponding to a current conducted by the electronic fuse while the short-circuit condition exists; a trigger circuit configured to generate the clamp signal while the short-circuit condition exists based on the sensed current; and a controller configured to control a power transistor of the electronic fuse to resist the current conducted by the electronic fuse while the short-circuit condition exists.

In some aspects, the techniques described herein relate to a method for controlling an electronic fuse, the method including: receiving an input voltage at an input of the electronic fuse; conducting a current from the input of the electronic fuse to an output of the electronic fuse through a power transistor; activating a diode-connected transistor in response to a short-circuit condition at the output, the short-circuit condition being an output voltage at the output of the electronic fuse lower than the input voltage by a turn-ON voltage of the diode-connected transistor; coupling a sense transistor to the input during the short-circuit condition using the diode-connected transistor that has been activated in response to the short-circuit condition; conducting a sensed current through the sense transistor while the sense transistor is coupled to the input; generate an mirror current based on the sensed current using a current mirror, the current mirror including the diode-connected transistor; generating clamp signal based on the mirror current; and controlling the power transistor in an OFF condition in response to the clamp signal.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

An electronic fuse (i.e., eFuse) can be used to protect a system from high currents that could cause failure, damage, and/or loss. Like a traditional fuse, the electronic fuse can conduct a current. When the current increases to a threshold, then the fuse may trip so that the electronic fuse resists (e.g., blocks) the current. Unlike the traditional fuse, the electronic fuse may be resettable and may provide additional functionality related to monitoring and responding to circuit conditions in addition to the current (e.g., voltages, temperature).

An electronic fuse may include a current control loop that can accurately (e.g., ±5%) sense a current conducted by the eFuse (i.e., $I_O$) and compare the sensed current to an over-current level (i.e., threshold). The threshold may be adjustable (e.g., trimmable) so that it can be set at some reasonable level above a nominal current of the system. For example, a threshold of 2.5 amps (A) may be set for a system expected to receive 2 A. The accuracy (e.g., ±5%) and adjustability of the threshold may allow it to be set closer to the nominal current than a traditional fuse, which can relax power handling requirements of the system. For example, a traditional fuse having a threshold with a wide variation (i.e., low accuracy) may have to be set well above 2 A to avoid tripping unnecessarily (e.g., 5 A), which can require the use of larger (i.e., heavier, more expensive) devices and conductors in the system. The accuracy of the electronic fuse, however, may come at the expense of its speed.

A high current may exist (e.g., occur) during an over current period between a first time at which the current increases to above the threshold and a second time at which the eFuse responds. It may be desirable to minimize the over current period to prevent excessive heating and/or damage. It may be problematic to minimize the over current period while maintaining accuracy, because satisfying both requirements may increase a complexity, size, and/or power consumption of the electronic fuse. The present disclosure addresses at least this technical problem with an electronic fuse that utilizes a clamp circuit that can quickly respond to fast over-current conditions, such as a short circuit. The clamp circuit can supplement the traditional current control loop so that the eFuse can be both accurate and fast. Further, the clamp circuit has less complexity, size, and power consumption that other fast response approaches.

Figure 1:
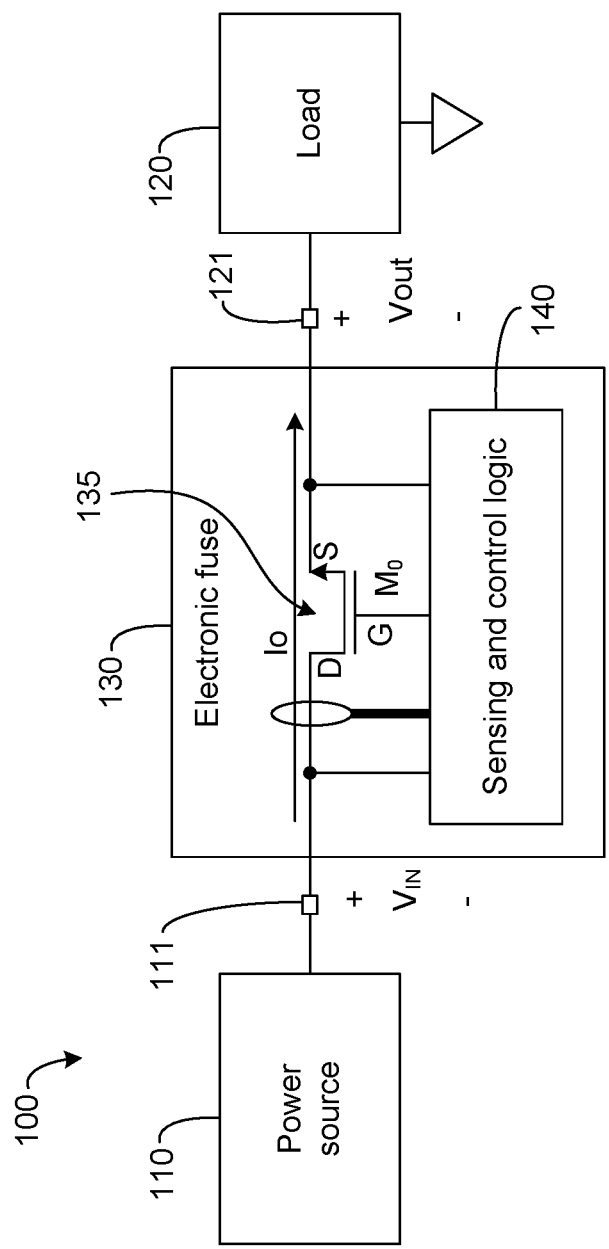
FIG. 1 is a block diagram of a system including an electronic fuse according to an implementation of the present disclosure.

FIG. 1 is a block diagram of a system including an electronic fuse according to an implementation of the present disclosure. The system 100 includes a power source 110 that is configured to supply power (i.e., voltage, current) to enable operation of a load 120. The power source may be any source of voltage/current, such as a battery, a power supply, a power converter, power inverter, generator, etc. The power source 110 may be coupled to an input 111 of an electronic fuse 130, which is coupled between the power source 110 and the load 120. The electronic fuse 130 may have an input voltage ($V_{IN}$) at an input port (i.e., input 111) and an output voltage ($V_{OUT}$) at an output port (i.e., output 121). The electronic fuse 130 includes a power transistor 135 ($M_O$). As shown, the power transistor 135 can be a metal oxide semiconductor field effect transistor (MOSFET) that is rated to operate in a high voltage (e.g., >10V) domain. The power transistor 135 can be configured (e.g., by a signal at a gate terminal (G)) in an ON-condition to conduct a current ($I_O$) between the input 111 and the output 121 of the electronic fuse 130. The electronic fuse 130 may further include sensing and control logic 140 to sense the input voltage ($V_{IN}$), the output voltage ($V_{OUT}$), and/or the current ($I_O$) to determine a condition of the load (i.e., load condition). In a heavy load condition (e.g., short-circuit condition), the output current may increase (i.e., from a normal condition). When the current becomes too high (e.g., compared to a nominal current) then the power transistor 135 may be configured in an OFF condition to resist (e.g., block) the current flowing between the input 111 and the output 121, otherwise the power transistor 135 may be configured in an ON condition to not resist (e.g., pass) the current flowing between the input 111 and the output 121.

Figure 2:
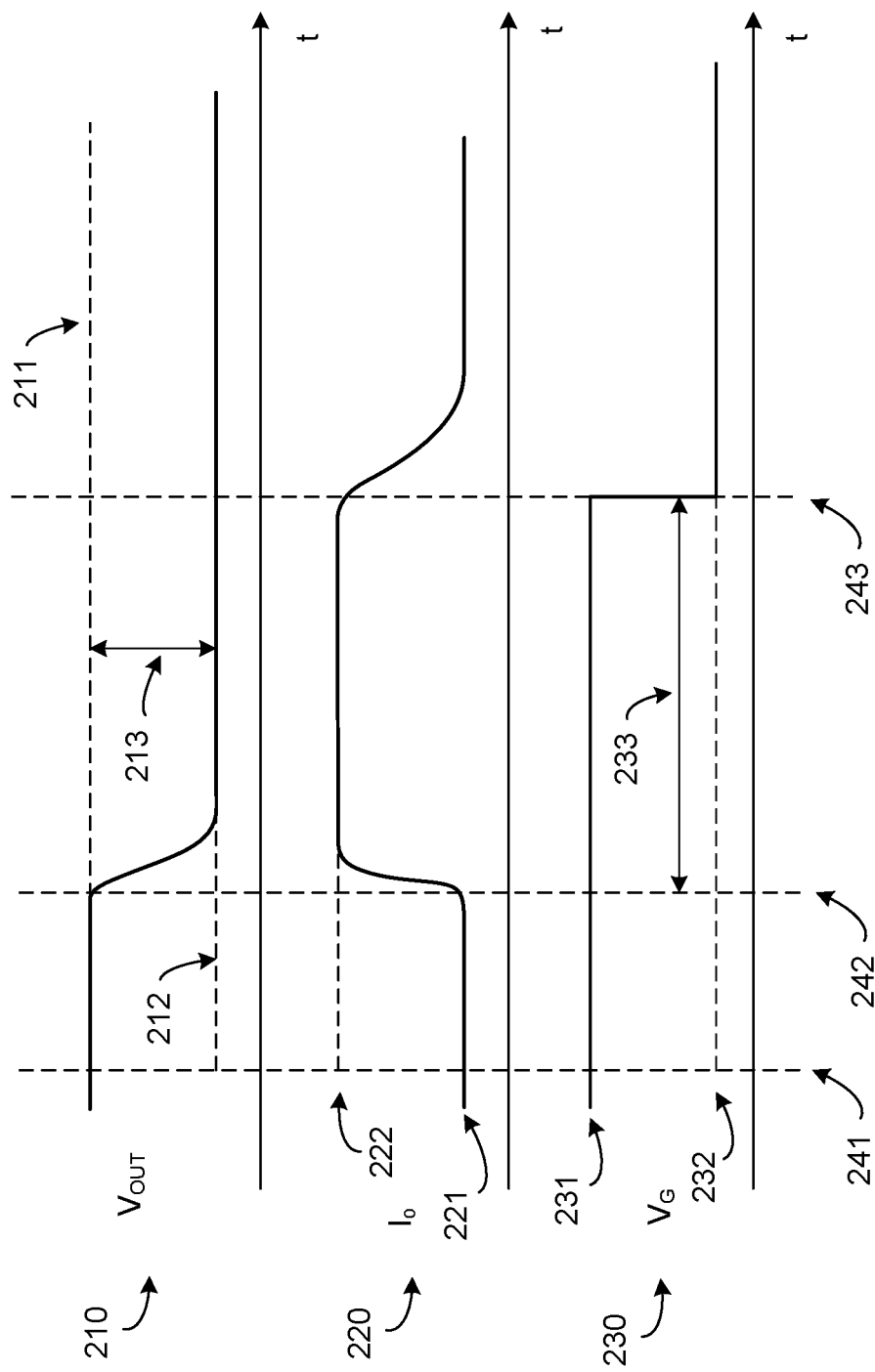
FIG. 2 are graphs illustrating signals of the system shown in FIG. 1.

FIG. 2 is a graph illustrating signals of the system shown in FIG. 1. A first graph 210 illustrates the output voltage ($V_{OUT}$) of the electronic fuse 130 versus time, a second graph 220 illustrates the current ($I_O$) through the power transistor 135 of the electronic fuse 130, and a third graph 230 illustrates a control signal ($V_G$) to configure an ON/OFF condition of the power transistor 135. The graphs are all aligned in time and have the same time scale.

At a first time 241, the power transistor 135 is in the ON condition because the control signal ($V_G$) is at an ON level 231, and the output voltage at a nominal voltage level 211 (e.g., 48V). The output voltage ($V_{OUT}$) may be the difference between the input voltage ($V_{IN}$) and the source-drain voltage of the power transistor 135 (i.e., $V_{OUT}=V_{IN}-V_{DS}$). At the first time 241, the source-drain voltage may be small so that the output voltage ($V_{OUT}$) approximately equals the input voltage ($V_{IN}$). At the first time 241, the power transistor 135 is conducting so that the current ($I_O$) is at a nominal current level 221 (e.g., 2.5 A).

At a second time 242, the load 120 is shorted. In other words, at the second time 242 the output 121 of the electronic fuse 130 is configured in a short-circuit condition. As a result, the output voltage ($V_{OUT}$) begins to decrease to the shorted load voltage (i.e., minimum voltage level 212), and the current ($I_O$) begins to increase from the nominal current level 221 to a maximum current level 222 determined by the power transistor 135. The time taken for the current to increase to the maximum current level 222 may be very fast (e.g., 1 milli-Ohm short in 1 microsecond) for a short that is purely resistive or that has a very low inductance (e.g., L<1 µH). At a third time 243, the electronic fuse will respond to the maximum current level 222 by transitioning the control signal ($V_G$) from the ON level 231 to an OFF level 232. As a result, an over-current period 233 during which the current ($I_O$) is at (or near) the maximum current level 222 exists (e.g., occurs) between the second time 242 at which the short occurs and the third time 243 at which the electronic fuse 130 responds.

It may be desirable to reduce (e.g., minimize) the over-current period 233. For example, a larger over-current period 233 may result in heating the power transistor 135 to a temperature outside of a safe operating area (SOA). A relatively shorter over-current period corresponds to a reduced power dissipated in the power transistor 135. A relatively shorter over-current period may also correspond to a reduced back electromotive force (EMF) generated by a (low) inductance present at the output 121 when the current is shut off at the end of the over-current period 233. The back EMF can cause a reverse polarity at the output 121, which can interfere with the operation of the system 100.

The electronic fuse 130 may include a current control loop configured to monitor the level of the current ($I_O$) and transmit the control signal at the OFF level 232 to shut down the current ($I_O$) when it satisfies at least one criterion (e.g., $I_O$ is greater than a threshold). The current control loop may respond relatively slowly for the short circuit scenario described above. To address this technical problem, the disclosed electronic fuse includes a clamp circuit capable of detecting and responding to a short-circuit condition faster than the control loop. As a result, the supplemental clamp circuit may be able to respond to a short-circuit condition faster than the current control loop could respond to the short-circuit condition. In other words, the supplemental clamp circuit may result in a first over current period (e.g., 240 nanoseconds) that is shorter than a second over current period (e.g., 840 nanoseconds) resulting from the current control loop. One reason for this improved speed is that the clamp circuit can sense and respond to a voltage difference 213 (e.g., voltage drop) of the output voltage ($V_{OUT}$), instead of sensing a current level.

Figure 3:
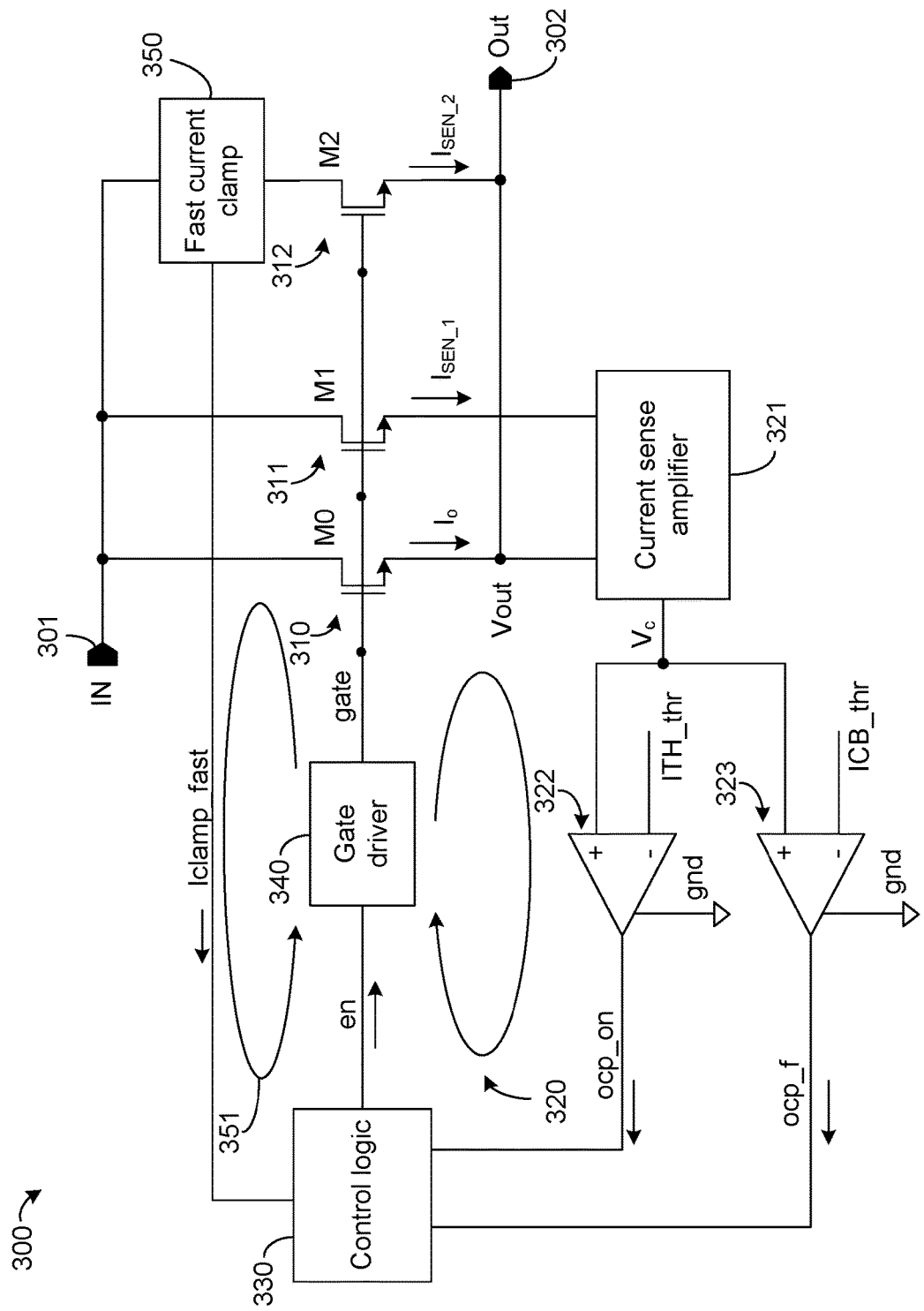
FIG. 3 is a schematic block diagram of an electronic fuse according to an implementation of the present disclosure.

FIG. 3 is a schematic block diagram of an electronic fuse according to an implementation of the present disclosure. The electronic fuse 300 is configured to receive an input voltage/current at an input 301, and to conduct the voltage/current to an output 302 in a normal condition. A normal condition may be a voltage/current level within an operating range (e.g., SOA) of the electronic fuse 300. The electronic fuse 300 is further configured to resist (e.g., block) the voltage/current to the output 302 in a fault condition. The fault condition may be a voltage/current level outside the operating range of the electronic fuse 300.

The electronic fuse 300 may include control logic (e.g., controller 330) configured to detect the condition (i.e., normal, fault) of the electronic fuse and generate an enable signal (en) to control an ON/OFF condition of a power transistor 310 (M0). The power transistor 310 may be an N-type MOSFET having its drain terminal (i.e., drain) coupled to the input 301 and its source terminal (i.e., source) coupled to the output 302. In a possible implementation, the electronic fuse 300 further includes a gate driver 340 that can convert a low power (e.g., digital) enable signal into a gate signal (i.e., gate) sufficient for controlling the power transistor 310 (M0), which may be designed (e.g., sized) to operate in a high-voltage (HV) domain (e.g., >10V).

While a load at the output 302 of the electronic fuse 300 is in a normal condition (i.e., while an impedance of the load is within an expected operating range), the controller 330 may configure the electronic fuse 300 in a normal condition (i.e., normal state). In the normal state, the power transistor 310 conducts an output current ($I_O$) between the input 301 and the output 302 without much change. The electronic fuse 300 further includes circuitry to detect an abnormal (i.e., fault) condition. For example, a fault condition may be detected when the impedance of the load drops. A slow (e.g., microseconds) drop of the impedance of the load may correspond to a heavy-load condition. A sudden (e.g., nanoseconds) drop of the impedance (e.g., resistance) of the load may correspond to a short-circuit condition.

The electronic fuse 300 may include a current control loop 320 configured to respond to a heavy-load condition by triggering the controller 330 to turn OFF the power transistor 310 when the output current ($I_O$) exceeds one or more thresholds.

The current control loop 320 includes a first sense transistor 311 (M1). The first sense transistor 311 may be coupled in parallel with the power transistor 310. As shown, the drain of the first sense transistor 311 may be coupled to the input 301 and the gate of the first sense transistor 311 may be coupled to the controller 330 (e.g., via the gate driver 340).

The current control loop 320 of the electronic fuse 300 further includes a current sense amplifier 321. The current sense amplifier 321 can hold the source of the power transistor 310 and the first sense transistor 311 at the same source voltage so that the sensed current ($I_{SEN\_1}$) conducted by the first sense transistor 311 is a scaled version of the current ($I_O$) conducted by the power transistor 310. For example, the sensed current (Is EN 1) may be a fraction of the output current (e.g., $I_{SEN\_1}=k \cdot I_O$ where 0≤k≤1), where the fraction may correspond to a size ratio the first sense transistor 311 to the power transistor 310 (e.g., k=1/3000). The current sense amplifier 321 can be further configured to output a current signal ($V_C$) corresponding to the sensed current ($I_{SEN\_1}$).

When the current signal satisfies at least one criterion, the controller 330 may be triggered to shut down the power transistor 310. The at least one criterion may be adjusted to protect the power transistor 310 and/or external circuitry (not shown) from damage. As shown, the current control loop 320 of the electronic fuse 300 may include a plurality of comparators configured to compare the current signal ($V_C$) to a plurality of thresholds and to generate a plurality of trigger signals based on the comparisons.

The current control loop 320 of the electronic fuse 300 includes a first comparator 322 ($U_0$). The first comparator 322 receives the current signal ($V_C$) from the current sense amplifier 321 at a positive input and receives a first threshold signal ($I_{TH\_thr}$) at a negative terminal so that the first comparator 322 activates (i.e., transitions LOW-to-HIGH) a first trigger signal (ocp_on) when the current signal ($V_C$) exceeds the first threshold ($I_{TH\_thr}$). The first threshold may be considered a soft threshold. When the current signal exceeds the soft threshold then the controller 330 may be configured to shut down (i.e., turn OFF) the power transistor 310 after some period (e.g., 1-3 milliseconds).

The current control loop 320 of the electronic fuse 300 includes a second comparator 323 ($U_1$). The second comparator 323 receives the current signal ($V_C$) from the current sense amplifier 321 at a positive input and receives a second threshold signal ($I_{CB\_thr}$) at a negative terminal so that the second comparator 323 activates (i.e., transitions LOW-to-HIGH) a second trigger signal (ocp_f) when the current signal ($V_C$) exceeds the second threshold ($I_{CB\_thr}$). The second threshold may be considered a hard threshold. The hard threshold may be greater than (e.g., 3 times) the soft threshold. When the current signal exceeds the hard threshold, then the controller 330 may be configured to shut down (i.e., turn OFF) the power transistor 310 immediately.

The current control loop 320 is excellent at accurately responding within a time suitable for a heavy-load condition. The current control loop 320 may be too slow, however, to respond within a time suitable for a short-circuit condition. The electronic fuse 300 may include a current clamp loop 351 configured to respond to a short-circuit condition by triggering the controller 330 to turn OFF the power transistor 310 when a short-circuit condition is detected at the output 302.

The current clamp loop 351 of the electronic fuse 300 may include a second sense transistor 312 (M2) configured to conduct a sensed current ($I_{SEN\_2}$) that is a scaled version of the current ($I_O$) conducted by the power transistor 310. For example, the sensed current ($I_{SEN\_2}$) may be a fraction of the output current (e.g., $I_{SEN\_2}=k \cdot I_O$ where 0≤k≤1), where the fraction may correspond to a size ratio the second sense transistor 312 to the power transistor 310 (e.g., k=1/3000).

The current clamp loop 351 of the electronic fuse may further include a fast current clamp (i.e., clamp circuit 350) coupled between the input 301 and a terminal (e.g., drain) of the second sense transistor 312. The clamp circuit 350 can respond to the short-circuit condition by activating (i.e., transitioning LOW-to-HIGH) a clamp signal (iclamp_fast) to trigger the controller 330 to shut down (i.e., turn OFF) the power transistor 310.

The current clamp loop 351 can respond faster than the current control loop 320 because it may only be configured to detect the existence of a short-circuit condition rather than measuring its degree. The limited functionality of the current clamp loop 351 may correspond to fewer devices than are required for the current control loop 320. Further, the power consumed by devices in the current clamp loop 351 may be smaller than the power consumed by devices in the current control loop 320. As will be shown, the clamp circuit 350 may be inactive during a normal condition so that its current consumption is approximately zero (within 0.1%) while the electronic fuse 300 is in a normal state. In other words, the current clamp loop 351 (i.e., clamp circuit) may have a quiescent current that is approximately zero while the normal condition exists at the output.

Figure 4:
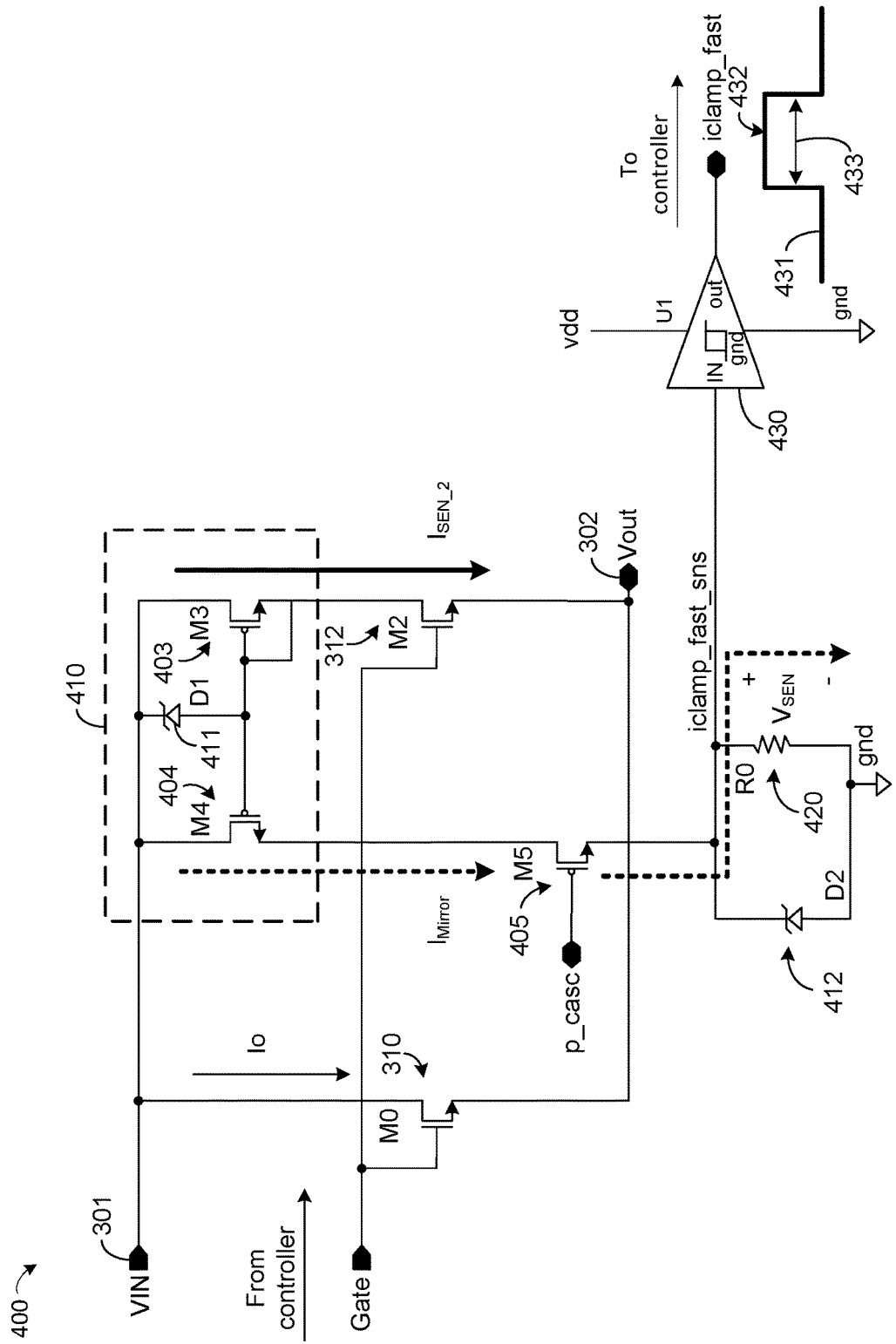
FIG. 4 is a schematic of a clamp circuit for an electronic fuse according to an implementation of the present disclosure.

FIG. 4 is a schematic of a clamp circuit 400 for an electronic fuse, such as shown in FIG. 3. As mentioned, the electronic fuse 300 includes a second sense transistor 312 (M2), which will be referred to in reference to FIG. 4 as simply the sense transistor. The sense transistor 312 is configured to conduct a sensed current ($I_{SEN\_2}$) that can be a scaled version of the current ($I_O$) conducted by the power transistor 310 (M0).

The clamp circuit 400 further includes a current mirror 410 configured to generate a mirror current ($I_{MIRROR}$) to mirror (i.e., match) the sensed current ($I_{SEN\_2}$). In other words, the current mirror may generate a mirror current that is a mirrored version of the sensed current. The current mirror includes a diode-connected transistor 403 (M3) and a mirror transistor 404 (M4) coupled (i.e., directly connected) at their gates in a current mirror topology. The diode-connected transistor has its gate coupled to its drain.

The diode-connected transistor 403 (M3) is coupled between the input 301 and the second sense transistor 312 of the electronic fuse 300 and may not conduct (i.e., turn-ON) until a short-circuit condition exists at the output 302. In a short-circuit condition, the output voltage (vout) at the output 302 may be different (e.g., less than) the input voltage (vin) at the input 301 by a difference that is greater than a threshold voltage (i.e., turn-ON voltage) of the diode-connected transistor. In other words, because the diode-connected transistor 403 may conduct very little (e.g., zero) current until a short circuit condition exists, the quiescent current (i.e., current drawn while inactive) of the clamp circuit 400 may be approximately zero in conditions other than a short-circuit condition.

The diode-connected transistor is coupled between the input and the sense transistor (i.e., in series with). When the output voltage is less than the input voltage by a turn-ON voltage of the diode-connected transistor 403, the diode-connected transistor 403 is configured to connect the second sense transistor 312 to the input 301. When the second sense transistor 312 is connected to the input 301, a sensed current ($I_{SEN\_2}$) flows through the second sense transistor 312. Because the second sense transistor 312 is connected in parallel with the power transistor 310, the sensed current ($I_{SEN\_2}$) that flows is a scaled version of the output current ($I_O$). While the diode-connected transistor 403 is turned-ON, the current mirror 410 is configured to generate a mirror current ($I_{MIRROR}$) flowing through the mirror transistor 404. The mirror current may be conducted to a resistor 420 (R0) in order to generate a sensed voltage ($V_{SEN}$). The sensed voltage may be input to a comparator 430 (e.g., Schmitt trigger) in order to generate the clamp signal (iclamp_fast). The comparator can be configured to output the clamp signal (iclamp_fast) while the sensed voltage ($V_{SEN}$) is above a threshold of the comparator 430. In a possible implementation, the clamp signal may be at a LOW level 431 while the load (not shown) is in normal state and at a HIGH level 432 (i.e., active) while the load is in a short-circuit condition. The active clamp signal may remain active (e.g., HIGH) for a period 433 while short-circuit condition exists.

The clamp circuit 400 may include devices configured to operate in a low-voltage (LV) domain (e.g., <10V), whereas the input voltage (vin) may be in a high-voltage (HV) domain (e.g., >10V). Accordingly, the clamp circuit 400 may include devices to ensure proper operation of the LV devices and to protect the LV devices from damage.

The current mirror 410 of the clamp circuit 400 may include a first Zener diode 411 (D1) coupled between the input and the gate terminals of the mirror transistor 404 and the diode-connected transistor 403. The first Zener diode 411 is configured to protect the gate terminals from high voltages at the input 301 of the electronic fuse 300.

The clamp circuit 400 may further include a cascode transistor 405 (M5) coupled between the mirror transistor 404 (M4) and the resistor 420 (R0) to reduce an operating voltage range (e.g., drain-source voltage) of the mirror transistor (M4) to a LV domain. In particular, the cascode transistor 405 can be coupled at a source to the mirror transistor 404 and at a drain to the resistor 420 and configured to drop a drain-source voltage so that the drain-source voltage of the mirror transistor 404 is reduced.

The current mirror 410 of the clamp circuit 400 may include a second Zener diode 412 (D2) coupled between the cascode transistor 405 and a ground. The second Zener diode 412 is configured to limit the sensed voltage ($V_{SEN}$) received by the comparator 430 to ensure proper operation and protect damage.

Figure 5:
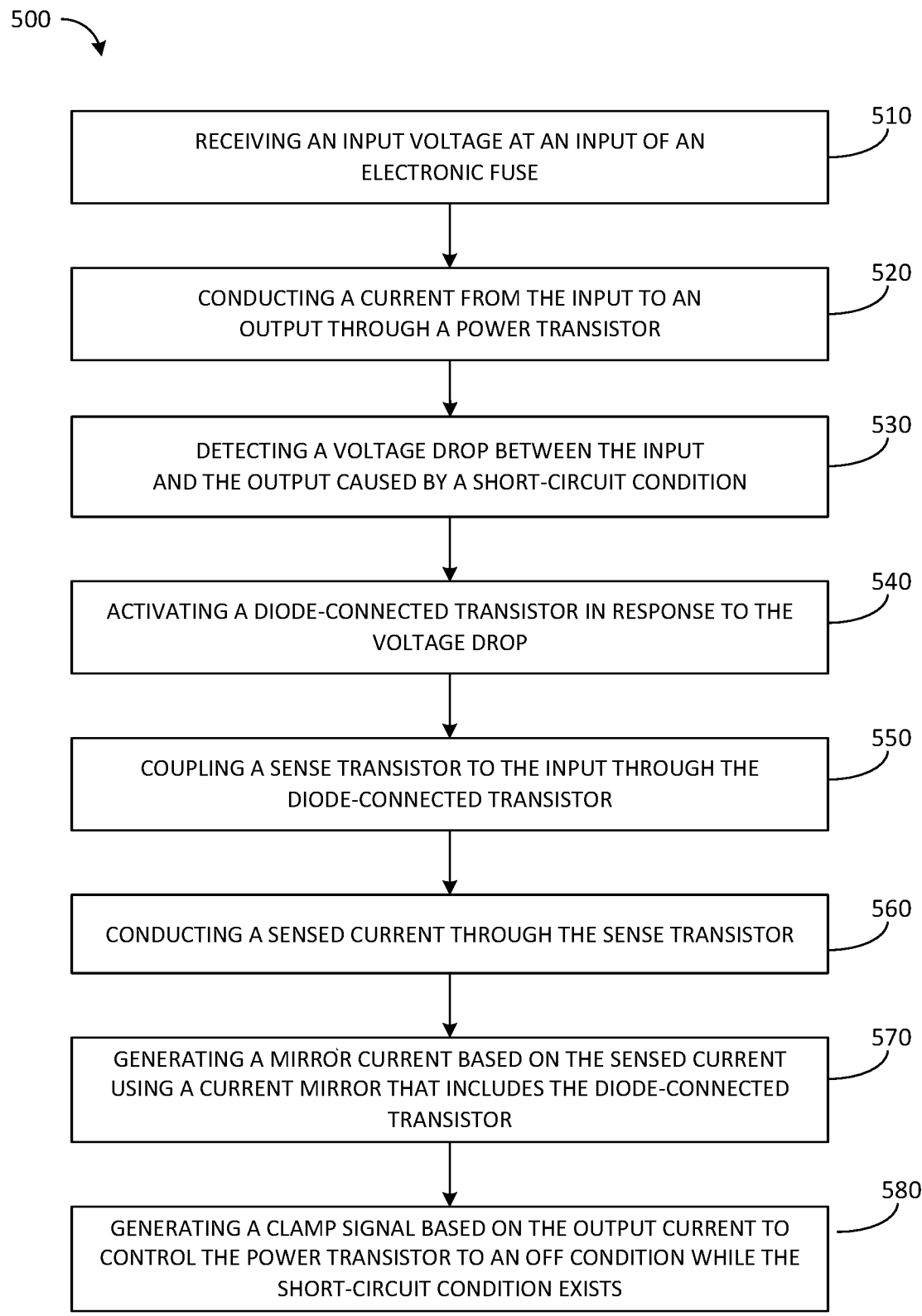
FIG. 5 is a flowchart of a method for controlling an electronic fuse according to an implementation of the present disclosure.

FIG. 5 is a flowchart of a method for controlling an electronic fuse according to an implementation of the present disclosure. The method 500 includes receiving 510 an input voltage (vin) at an input of an electronic fuse and conducting 520 a current (IO) from the input to an output through a power transistor (M0). The method 500 further includes detecting 530 a voltage difference (e.g., voltage drop) between the input and the output caused by a short-circuit condition and activating 540 a diode-connected transistor in response to the short-circuit condition at the output. In other words, the short-circuit condition may be an output voltage at an output of the electronic fuse being lower than the input voltage of the electronic fuse by a turn-ON voltage (i.e., threshold voltage) of the diode-connected transistor. The method 500 further includes coupling 550 a sense transistor to the input through the diode-connected transistor and conducting 560 a sensed current through the sense transistor. The method 500 further includes generating 570 a mirror current based on the sensed current using a current mirror, where the current mirror includes the diode-connected transistor, and generating 580 a clamp signal based on the output current. The clamp signal can be used to control the power transistor to an OFF condition while the short-circuit condition exists.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. An electronic fuse comprising:
    a power transistor coupled between an input and an output of the electronic fuse, the power transistor configurable in an OFF condition to disconnect the input from the output while a short-circuit condition exists at the output; and
    a clamp circuit configured to generate a clamp signal in response to the short-circuit condition, the clamp circuit including:
        a sense transistor coupled in parallel with the power transistor;
        a diode-connected transistor coupled to the input of the electronic fuse and in series with the sense transistor, the diode-connected transistor configured to conduct while the short-circuit condition exists so that the sense transistor conducts a sensed current corresponding to a current conducted by the power transistor while the short-circuit condition exists; and
        a trigger circuit configured to generate the clamp signal to configure the power transistor in the OFF condition based on the sensed current.

2. The electronic fuse according to claim 1, wherein:
    the short-circuit condition exists at the output when an output voltage of the electronic fuse is less than an input voltage of the electronic fuse by at least a threshold voltage; or
    a normal condition exists at the output while a difference between the output voltage of the electronic fuse and the input voltage of the electronic fuse is less than the threshold voltage.

3. The electronic fuse according to claim 2, further comprising a controller configured to:
    receive the clamp signal having a first level corresponding to the short-circuit condition and a second level corresponding to the normal condition;
    configure the power transistor in the OFF condition while the clamp signal is at the first level; and
    configure the power transistor in an ON condition while the clamp signal is at the second level.

4. The electronic fuse according to claim 2, wherein: the diode-connected transistor is configured to not conduct while the normal condition exists at the output.

5. The electronic fuse according to claim 4, wherein: the clamp circuit has a quiescent current that is approximately zero while the normal condition exists at the output.

6. The electronic fuse according to claim 2, wherein the threshold voltage is a turn-ON voltage of the diode-connected transistor.

7. The electronic fuse according to claim 1, wherein the clamp circuit further includes:
    a mirror transistor configured to conduct a mirror current corresponding to the sensed current while the short-circuit condition exists, wherein:
        the mirror transistor and the diode-connected transistor have gate terminals that are directly connected together; and
        the mirror transistor and the diode-connected transistor have source terminals that are directly connected together to the input of the electronic fuse.

8. The electronic fuse according to claim 7, wherein the mirror transistor and the diode-connected transistor form a current mirror so that the mirror current corresponds to the sensed current according to a size ratio between the mirror transistor and the diode-connected transistor.

9. The electronic fuse according to claim 7, wherein the clamp circuit further includes a Zener diode coupled between the input and the gate terminals, the Zener diode configured to protect the gate terminals from high voltages at the input of the electronic fuse.

10. The electronic fuse according to claim 7, wherein the trigger circuit includes:
    a resistor configured to generate a sensed voltage based on the mirror current; and
    a comparator coupled to the resistor and configured to output the clamp signal when the sensed voltage is above a threshold.

11. The electronic fuse according to claim 10, wherein the clamp circuit further includes a cascode transistor coupled between a drain terminal of the mirror transistor and the resistor to reduce an operating voltage range of the mirror transistor.

12. The electronic fuse according to claim 10, wherein the trigger circuit further includes:
    a Zener diode configured to limit the sensed voltage received by the comparator.

13. The electronic fuse according to claim 1, wherein:
    the power transistor is rated for voltages in a high-voltage domain; and
    the diode-connected transistor is rated for a low-voltage domain.

14. A system comprising:
    a power source configured to generate output power;
    a load configured to operate based on the output power from the power source; and
    an electronic fuse coupled at an input to the power source and coupled at an output to the load, the electronic fuse including:
        a clamp circuit configured to generate a clamp signal in response to a short-circuit condition at the output, the clamp circuit including:
            a diode-connected transistor coupled to the input and in series with a sense transistor, the diode-connected transistor configured to conduct while the short-circuit condition exists so that the sense transistor conducts a sensed current corresponding to a current conducted by the electronic fuse while the short-circuit condition exists;

a trigger circuit configured to generate the clamp signal while the short-circuit condition exists based on the sensed current; and a controller configured to control a power transistor of the electronic fuse to block the current conducted by the electronic fuse while the short-circuit condition exists.

15. The system according to claim 14, wherein:

when the load is a relatively small inductance, the current of the power transistor rises a relatively fast rate in the short-circuit condition;

when the load is a relatively large inductance, the current of the power transistor rises at a relatively slow rate in the short-circuit condition; and the clamp circuit is configured to respond to the relatively fast rate so that a time that the power transistor is in an ON condition during the short-circuit condition corresponds to a relatively shorter over-current period as compared to a relatively longer over-current period without the clamp circuit.

16. The system according to claim 15, wherein the relatively shorter over-current period corresponds to a reduced power dissipated in the power transistor and a reduced back EMF of the load.

17. The system according to claim 14, wherein:

the short-circuit condition exists when an output voltage of the electronic fuse is less than an input voltage of the electronic fuse by a turn-ON voltage of the diode-connected transistor (M3).

18. A method for controlling an electronic fuse, the method including:

receiving an input voltage at an input of the electronic fuse;

conducting a current from the input of the electronic fuse to an output of the electronic fuse through a power transistor;

activating a diode-connected transistor in response to a short-circuit condition at the output, the short-circuit condition being an output voltage at the output of the electronic fuse lower than the input voltage by a turn-ON voltage of the diode-connected transistor;

coupling a sense transistor to the input during the short-circuit condition using the diode-connected transistor that has been activated in response to the short-circuit condition;

conducting a sensed current through the sense transistor while the sense transistor is coupled to the input;

generating a mirror current based on the sensed current using a current mirror, the current mirror including the diode-connected transistor;

generating clamp signal based on the mirror current; and controlling the power transistor in an OFF condition in response to the clamp signal.

19. The method according to claim 18, wherein generating the clamp signal based on the mirror current includes:

converting the mirror current to a sensed voltage; and comparing the sensed voltage to a threshold.

20. The method according to claim 19, wherein controlling the power transistor in the OFF condition in response to the clamp signal includes:

controlling the power transistor in the OFF condition when the sensed voltage is above the threshold.

* * * * *